United States Patent
Inatomi

(10) Patent No.: US 7,819,076 B2
(45) Date of Patent: Oct. 26, 2010

(54) SUBSTRATE TREATMENT METHOD AND SUBSTRATE TREATMENT APPARATUS

(75) Inventor: Yuichiro Inatomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 771 days.

(21) Appl. No.: 11/578,165

(22) PCT Filed: Apr. 8, 2005

(86) PCT No.: PCT/JP2005/006913

§ 371 (c)(1),
(2), (4) Date: Oct. 11, 2006

(87) PCT Pub. No.: WO2005/104194

PCT Pub. Date: Nov. 3, 2005

(65) Prior Publication Data

US 2007/0238028 A1 Oct. 11, 2007

(30) Foreign Application Priority Data

Apr. 20, 2004 (JP) ............................. 2004-124193

(51) Int. Cl.
*B05C 11/00* (2006.01)
(52) U.S. Cl. ........................................ 118/63; 118/301
(58) Field of Classification Search ................. 118/301, 118/302, 63; 239/549, 502, 518, 103, 104, 239/461, 504, 292, 300
See application file for complete search history.

(56) References Cited

U.S. PATENT DOCUMENTS

| | | | | |
|---|---|---|---|---|
| 4,987,854 A | * | 1/1991 | Hall | 118/679 |
| 5,250,114 A | * | 10/1993 | Konishi et al. | 118/321 |
| 5,690,740 A | * | 11/1997 | Smith | 118/300 |
| 5,769,946 A | * | 6/1998 | Kutsuzawa et al. | 118/407 |
| 5,902,399 A | * | 5/1999 | Courtenay | 118/52 |
| 5,904,301 A | * | 5/1999 | Kajiyama et al. | 239/549 |
| 6,322,009 B1 | * | 11/2001 | Subramanian et al. | 239/548 |
| 6,729,041 B2 | | 5/2004 | Shindo et al. | |
| 2002/0132480 A1 | | 9/2002 | Shindo et al. | |

FOREIGN PATENT DOCUMENTS

JP 51 150279 12/1976

(Continued)

*Primary Examiner*—Brenda A Lamb
(74) *Attorney, Agent, or Firm*—Oblon, Spivak, McClelland, Maier & Neustadt, L.L.P.

(57) ABSTRACT

A substrate treatment apparatus which uniformly forms a fine resist pattern with a desired dimension within a plane of a substrate is disclosed. In a solvent vapor supply unit, a solvent vapor discharge nozzle is provided which can discharge a solvent vapor for swelling a resist pattern while moving above the front surface of a wafer. The wafer for which developing treatment has been finished and on which a resist pattern has been formed is carried into the solvent vapor supply unit, and the solvent vapor discharge nozzle is moved above the front surface of the wafer, so that the solvent vapor discharge nozzle supplies the solvent vapor onto the front surface of the wafer. This uniformly supplies a predetermined amount of solvent vapor to the resist pattern on the front surface of the wafer. As a result, the solvent vapor causes the resist pattern to evenly swell by a predetermined dimension, so that a resist pattern with a desired dimension is finally uniformly formed within the plane of the wafer.

8 Claims, 14 Drawing Sheets

| | FOREIGN PATENT DOCUMENTS | |
|---|---|---|
| JP | 64 69014 | 3/1989 |
| JP | 7 5695 | 1/1995 |
| JP | 8 234451 | 9/1996 |
| JP | 10-50595 | 2/1998 |
| JP | 2002 217160 | 8/2002 |
| JP | 2005 19969 | 1/2005 |
| WO | 98 37575 | 8/1998 |
| WO | WO 2004/109779 | 12/2004 |

* cited by examiner

SUBSTRATE TREATMENT METHOD AND SUBSTRATE TREATMENT APPARATUS

TECHNICAL FIELD

The present invention relates to a substrate treatment method and a substrate treatment apparatus for a substrate having a resist pattern formed thereon.

BACKGROUND ART

In photolithography steps in a semiconductor device manufacturing process, for example, a resist coating treatment of applying a resist solution onto a substrate to form a resist film, exposure processing of exposing a predetermined pattern on the resist film on the substrate, developing treatment of supplying a developing solution to the substrate for which exposure processing has been performed to develop the resist film and so on are performed to form a predetermined resist pattern on the substrate.

However, to increase the performance of the semiconductor device, it is necessary to advance the miniaturization of the resist pattern. Conventionally, the miniaturization of the resist pattern has been advanced by increasing the exposure resolution in the exposure processing. There is a limit in increasing the resolution performance of exposure apparatus in which exposure processing is performed, and therefore it is difficult to further miniaturize the resist pattern in the future.

Hence, there proposed is, as a method other than the one increasing the resolution performance of exposure apparatus, for example, a method of housing a substrate having a resist pattern formed thereon in a container which stores a solvent material at the bottom portion to expose the substrate to a resist solvent vapor atmosphere. According to this method, since the resist pattern is dissolved with the solvent to flow, for example, the area of a window in the resist pattern can be decreased to miniaturize the resist pattern (for example, Patent Document 1).

[Patent Document] Japanese Patent Application Laid-open No. S51-150279

DISCLOSURE OF THE INVENTION

Problems to be Solved by the Invention

However, in the above method, since the substrate is exposed to the solvent atmosphere in the container and waits for the solvent vapor in the atmosphere to adhere to the substrate by itself, the supply amount of the solvent vapor to the substrate cannot be precisely controlled. Therefore, the dimension of the finally formed resist pattern varies to make it difficult to form a groove with a desired line width and a contact hole with a desired diameter on the substrate.

Further, according to the above method, since the outside air flows into the container and a temperature distribution occurs in the container when the substrate is carried into/out of the container to cause the atmosphere in the container to flow at all times, the concentration of the solvent atmosphere in the container cannot be kept uniform. Therefore, the amount of adherence of the solvent vapor varies within the plane of the substrate, whereby the flow of the resist pattern may vary due to the adherence of the solvent vapor. This may make the dimension of the finally formed resist pattern non-uniform within the plane of the substrate.

The present invention has been developed in consideration of the above viewpoints and its object is to provide a substrate treatment method and a substrate treatment apparatus for supplying a predetermined amount of solvent vapor to the resist pattern on the substrate evenly within the substrate to from a fine resist pattern with a desired dimension uniform within the substrate.

Means for Solving the Problems

To attain the above object, the present invention is a treatment method of treating a substrate having a resist pattern formed thereon, including the step of supplying a solvent vapor for the resist pattern to a partial region on a front surface of the substrate and shifting the region to which the solvent vapor is supplied to thereby supply the solvent vapor to the entire front surface of the substrate to swell the resist pattern on the substrate. Note that the supply of the solvent vapor to the front surface of the substrate is performed after formation of the resist pattern and before performance of etching treatment.

According to the present invention, since the solvent vapor is supplied to the entire front surface of the substrate by shifting the region to which the solvent vapor for the resist pattern on the substrate is supplied, the supply amount of the solvent vapor to the substrate can be precisely controlled. This allows a precise control of the swelling amount of the resist pattern by the solvent vapor, that is, the amount of reducing the line width or the like, to form a fine resist pattern in a desired dimension. Further, since the solvent vapor can be supplied evenly within the plane of the substrate, the dimension of the resist pattern can be made uniform within the plane of the substrate.

The supply of the solvent vapor to the entire front surface of the substrate may be performed a plurality of times with a direction of shifting the region to which the solvent vapor is supplied being changed. In this case, the solvent vapor can be supplied without unevenness within the plane of the substrate, whereby the dimension of the resist pattern reduced by the supply of the solvent vapor can be made more uniform within the plane of the substrate.

Before the supply of the solvent vapor, another solvent vapor for homogenizing the surface of the resist pattern may be supplied. In this case, the solvent vapor is supplied to the resist pattern whose surface has been homogenized so that the whole resist pattern uniformly reacts with the solvent vapor to swell, and therefore the uniformity of the dimension of the resist pattern within the plane of the substrate can be further improved.

After swelling the resist pattern, the substrate may be heated. In this case, for example, an excessive solvent remaining in the resist pattern can be evaporated.

According to another aspect of the present invention, the present invention is a treatment apparatus for treating a substrate having a resist pattern formed thereon, including a solvent vapor discharge nozzle capable of discharging a solvent vapor for swelling the resist pattern to a partial region on a front surface of the substrate; and a nozzle moving mechanism for moving the solvent vapor discharge nozzle discharging the solvent vapor along the front surface of the substrate.

According to the present invention, the solvent vapor can be supplied to the entire front surface of the substrate by moving, along the front surface of the substrate, the solvent vapor discharge nozzle discharging the solvent vapor to a part of the front surface of the substrate. In this case, the supply amount of the solvent vapor to each portion of the front surface of the substrate can be precisely controlled, thus allowing a precise control of the swelling amount of the resist pattern by the solvent vapor, that is, the amount of reducing the line width or the like. As a result, a fine resist pattern can be formed in a desired dimension. Further, since the solvent vapor can be evenly supplied within the plane of the substrate, the dimension of the resist pattern within the plane of the substrate can be made uniform.

The solvent vapor discharge nozzle may have a discharge port for discharging the solvent vapor toward the substrate and a current member for straightening the current of the solvent vapor to prevent the solvent vapor from diffusing from the region to which the solvent vapor is discharged from the discharge port. In this case, it is possible to prevent the solvent vapor from diffusing from the region to which the solvent vapor is discharged, so that the supply amount of the solvent vapor to each portion of the substrate can be precisely controlled. As a result, the dimension of the resist pattern can be precisely controlled.

The solvent vapor discharge nozzle may have a main body having an almost rectangular parallelepiped shape long in a direction perpendicular to the moving direction of the solvent vapor discharge nozzle, the discharge port may be formed in a lower surface of the main body along a longitudinal direction of the main body to be able to discharge the solvent vapor over at least a length of a diameter of the substrate, and the current member may be provided at least ahead of the discharge port in the moving direction on the lower surface of the main body of the solvent vapor discharge nozzle. In this case, the solvent vapor can be supplied to the entire front surface of the substrate by moving the solvent vapor discharge nozzle discharging the solvent vapor from one end portion side to the other end portion side of the substrate. Further, it is possible to prevent the solvent vapor from diffusing frontward where the solvent vapor is easily absorbed by the substrate, thus allowing a precise control of the supply amount of the solvent vapor to each portion on the substrate. Note that the current members may be provided on both sides of the discharge port in the moving direction.

The solvent vapor discharge nozzle may have an opening for allowing the solvent vapor to pass in the direction perpendicular to the moving direction at the lower surface of the main body. In this case, the solvent vapor supplied from the discharge port and remains not in use can be preferably exhausted from the opening.

The discharge port may be formed at a middle portion in the moving direction of the lower surface of the main body, and the current member may protrude downward from an end portion in the moving direction of the lower surface of the main body and may be formed in a length corresponding to the discharge port along the longitudinal direction of the main body.

The solvent vapor discharge nozzle may be provided with a gas supply port for supplying an inert gas or a nitrogen gas to a periphery of the region on the substrate to which the solvent vapor is discharged. The supply of gas can form an air curtain to prevent the solvent vapor from diffusing from the region on the substrate. Further, even if the solvent vapor diffuses from the region on the substrate, the solvent vapor can be diluted to prevent the resist pattern from swelling out of the region.

The gas supply port may be provided ahead of the discharge port in the moving direction of the solvent vapor discharge nozzle or on both sides of the discharge port in the moving direction. Further, the gas supply port may be provided in the current member.

The solvent vapor discharge nozzle may have another discharge port for discharging another solvent vapor for homogenizing the surface of the resist pattern. In this case, before the supply of the solvent vapor onto the substrate, the other solvent vapor can be supplied. As a result, the whole resist pattern uniformly reacts with the solvent vapor and uniformly swells at the time of supplying the solvent vapor, so that the dimension of the finally formed resist pattern can be made more uniform within the plane of the substrate.

Effect of the Invention

According to the present invention, a fine resist pattern with a desired dimension can be formed uniformly within the plane of the substrate.

EXPLANATION OF CODES 1 coating and developing treatment system
33 solvent supply unit
131 solvent vapor discharge nozzle
152 discharge port
P resist pattern
W wafer

BEST MODE FOR CARRYING OUT THE INVENTION

Figure 1:
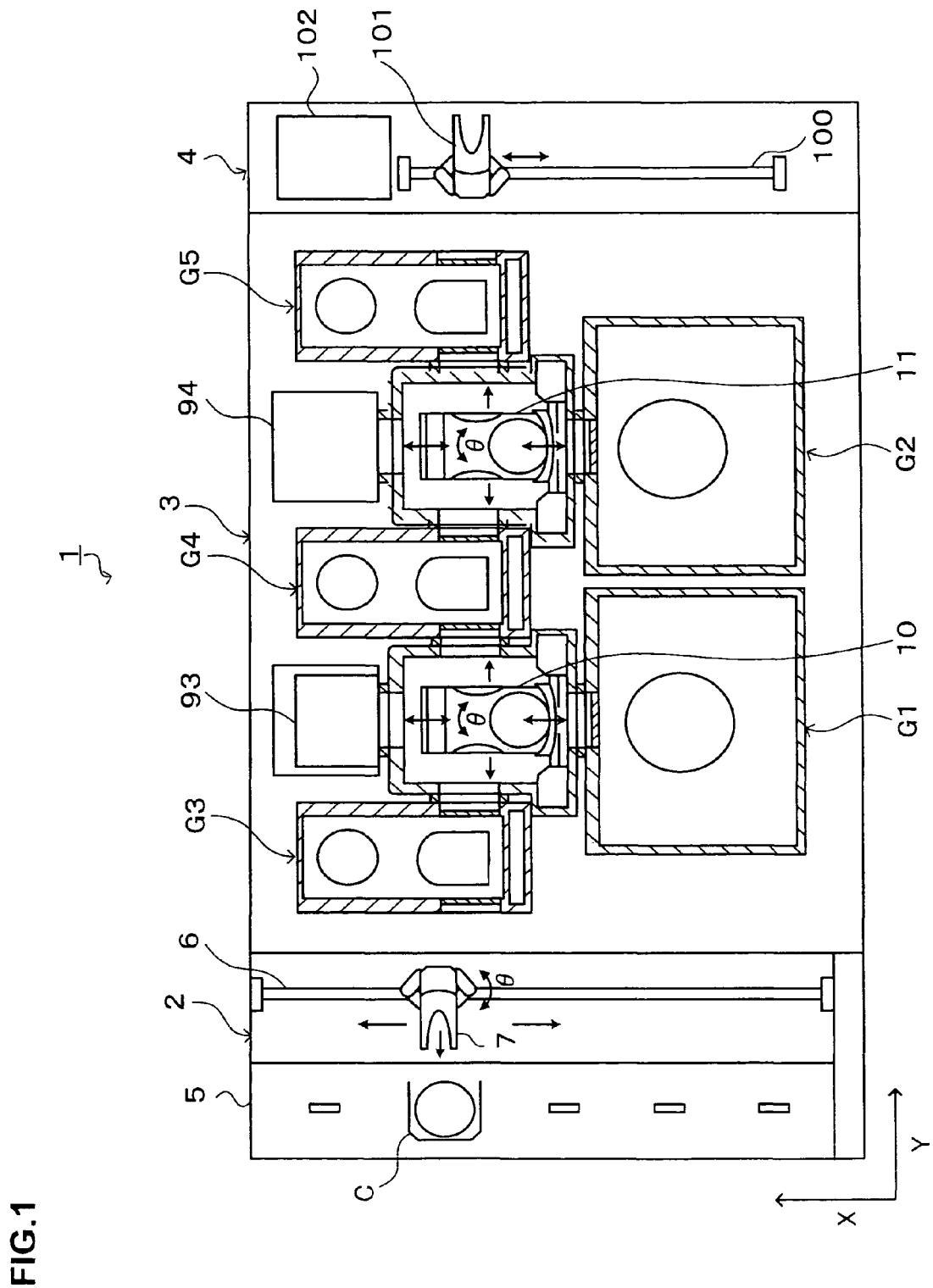
[FIG. 1]
A plan view showing the outline of a configuration of a coating and developing treatment system according to the present embodiment.
Figure 2:
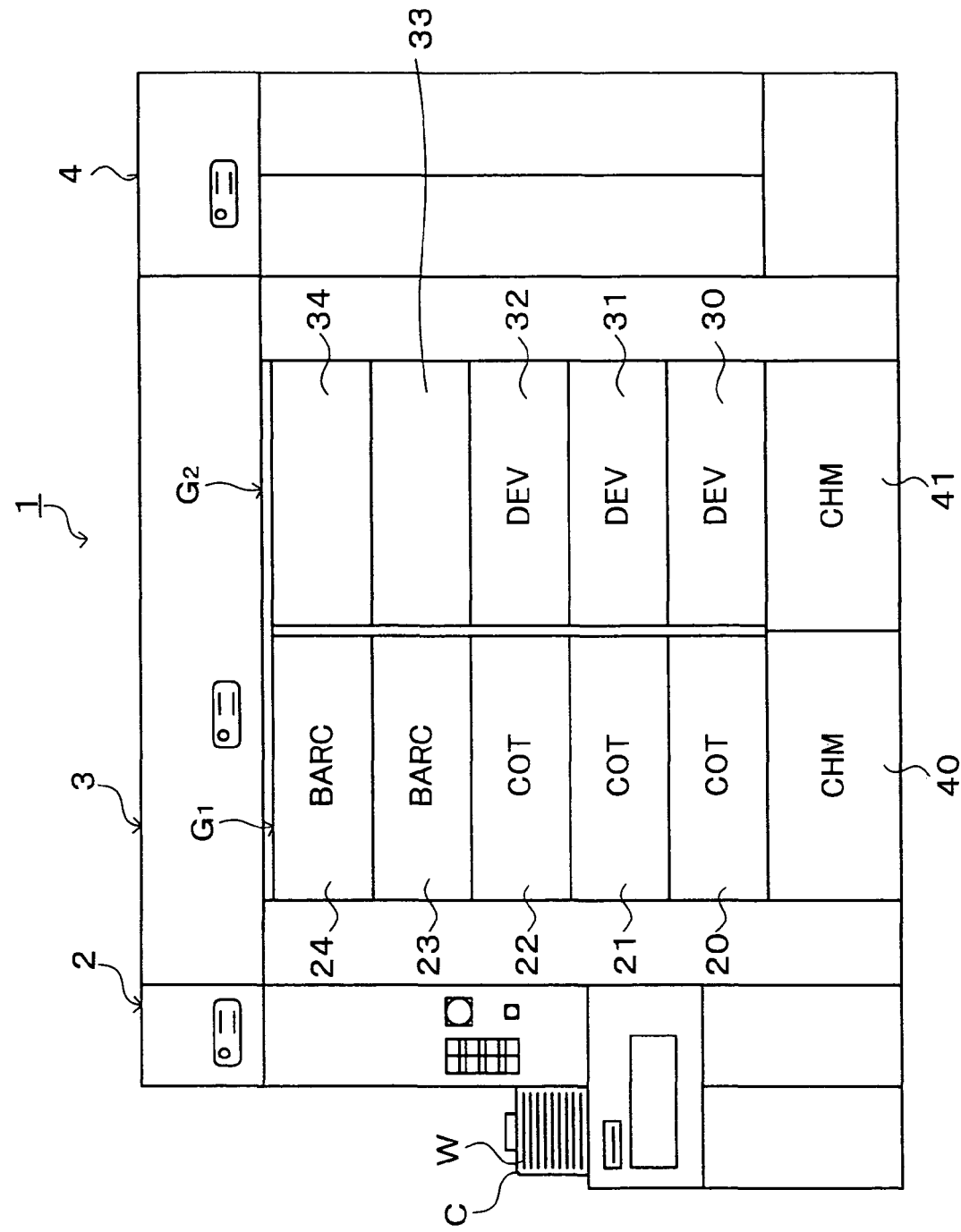
[FIG. 2]
A front view of the coating and developing treatment system in FIG. 1.
Figure 3:
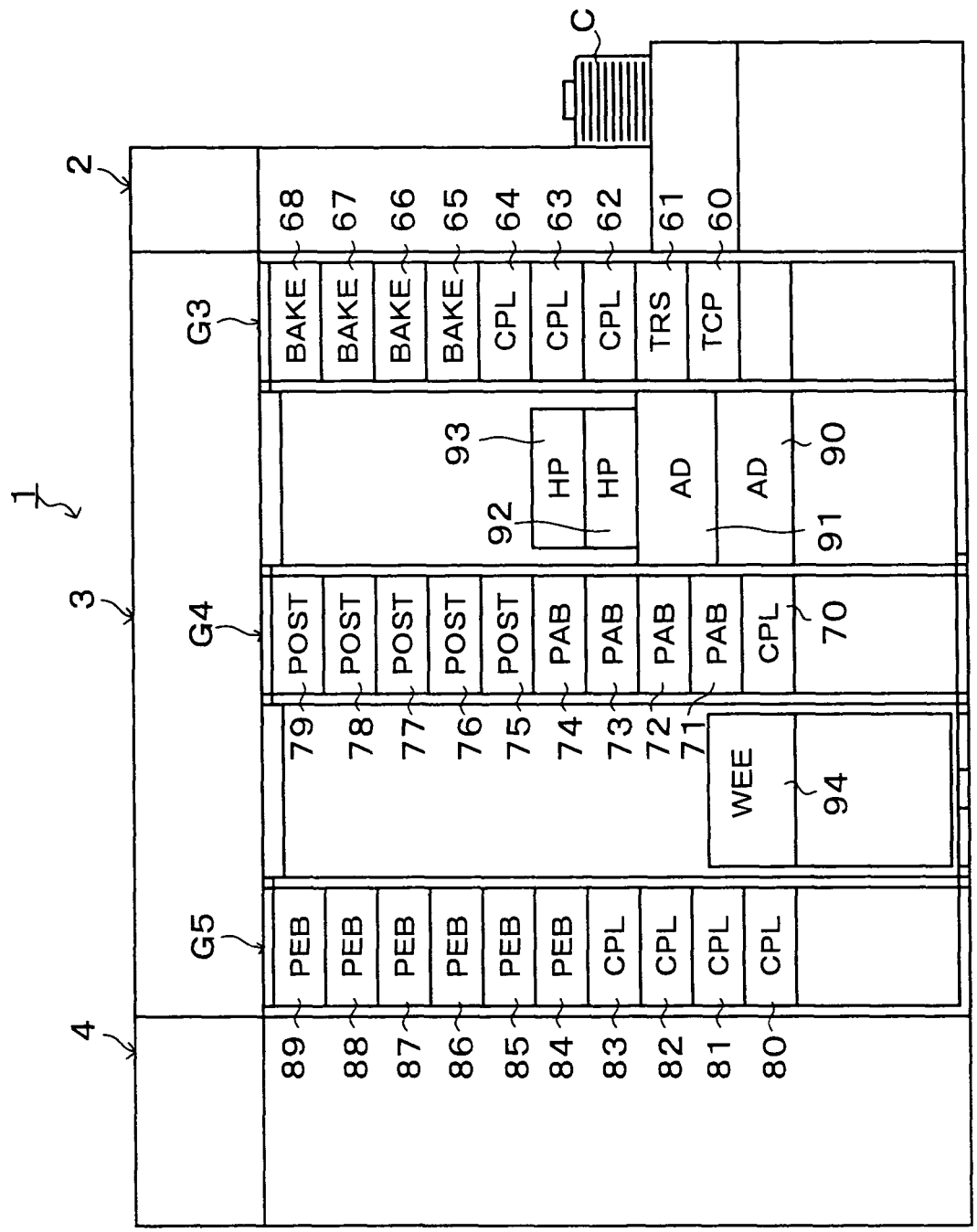
[FIG. 3]
A rear view of the coating and developing treatment system in FIG. 1.

Hereinafter, preferred embodiments of the present invention will be described. FIG. 1 is a plan view showing the outline of a configuration of a coating and developing treatment system 1 in which a substrate treatment apparatus according to the present invention is installed, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including a plurality of various kinds of processing and treatment units, which are multi-tiered, for performing predetermined processing or treatment in a manner of single wafer processing in the coating and developing treatment steps; and an interface section 4 for transferring the wafers W to/from a not-shown aligner provided adjacent to the processing station 3, are integrally connected together.

In the cassette station 2, a plurality of cassettes C can be mounted at predetermined positions on a cassette mounting table 5 in a line in an X-direction (a top-to-bottom direction in FIG. 1). In the cassette station 2, a wafer carrier 7 is provided which is movable in the X-direction on a carrier path 6. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7, which is rotatable in a θ-direction around the Z-axis, can access a temperature regulating unit 60 and a transition unit 61 which will be described later included in a third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30, 31 and 32 each for supplying a developing solution to the wafer W to develop it and solvent supply units 33 and 34 as substrate treatment apparatuses according to this embodiment are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62, 63 and 64 each for temperature-regulating the wafer W under temperature control with a high precision, and high-temperature thermal processing units 65, 66, 67 and 68 each for heat-processing the wafer W at a high temperature, are nine-tiered in order from the bottom.

In the fourth processing unit group G4, for example, a high-precision temperature regulating unit 70, pre-baking units 71, 72, 73 and 74 each for heat-processing the wafer W after resist coating treatment, and post-baking units 75, 76, 77, 78 and 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units 80, 81, 82 and 83 and post-exposure baking units 84, 85, 86, 87, 88 and 89 each for heat-processing the wafer W after exposure, are ten-tiered in order from the bottom.

A plurality of processing and treatment units are arranged on the positive direction side in the X-direction (on the upper side in the drawing) of the first carrier unit 10 as shown in FIG. 1, for example, adhesion units 90 and 91 each for performing hydrophobic treatment for the wafer W and heating units 92 and 93 each for heating the wafer W being four-tiered in order from the bottom as shown in FIG. 3. As shown in FIG. 1, on the positive direction side in the X-direction (on the upper side in the drawing) of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction (the vertical direction) and also rotatable in the θ-direction and thus can access the not-shown aligner adjacent to the interface section 4, the buffer cassette 102, and the fifth processing unit group G5 and carry the wafer W to them.

Figure 4:
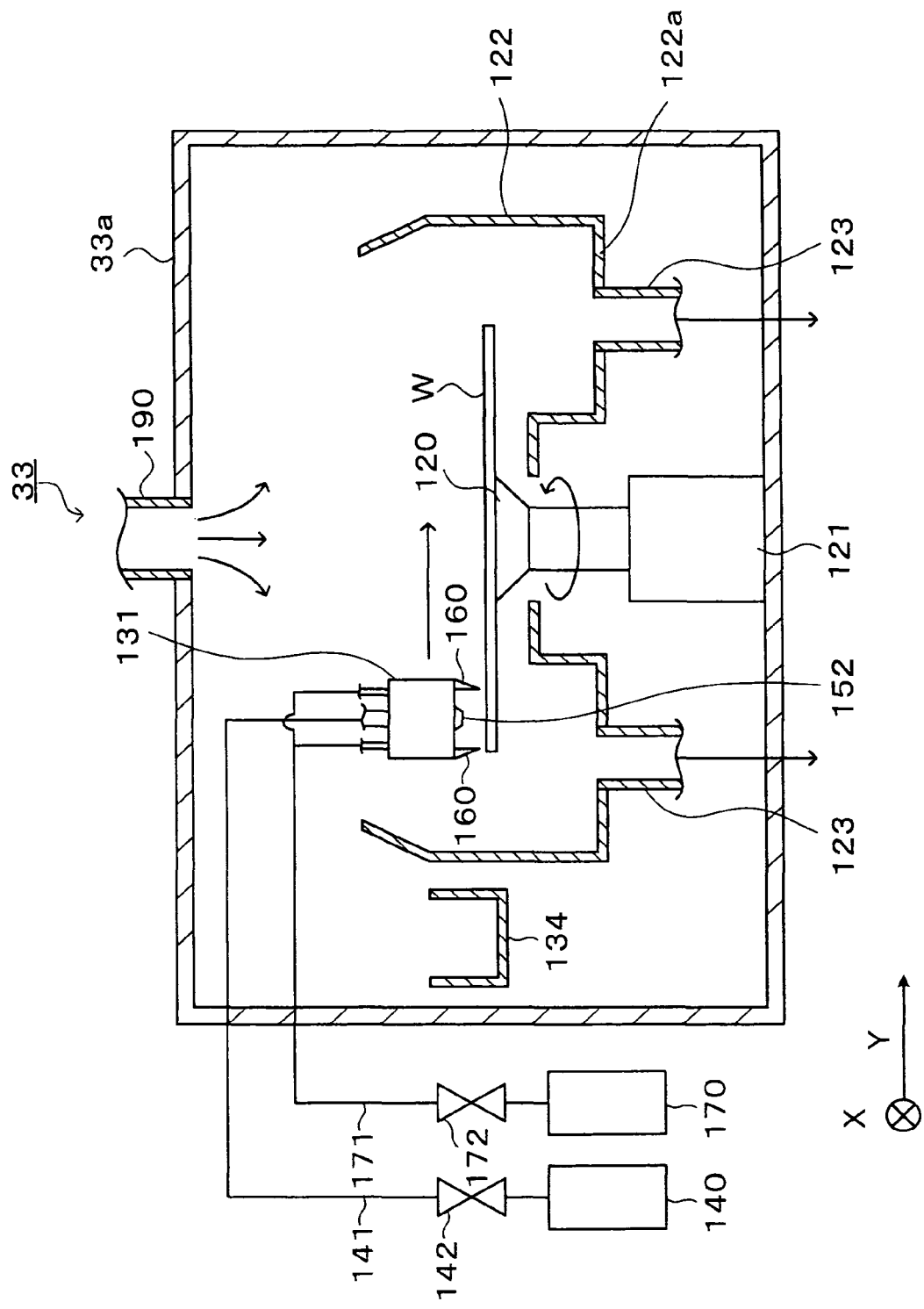
[FIG. 4]
An explanatory view of a longitudinal section showing the outline of a configuration of a solvent supply unit.
Figure 5:
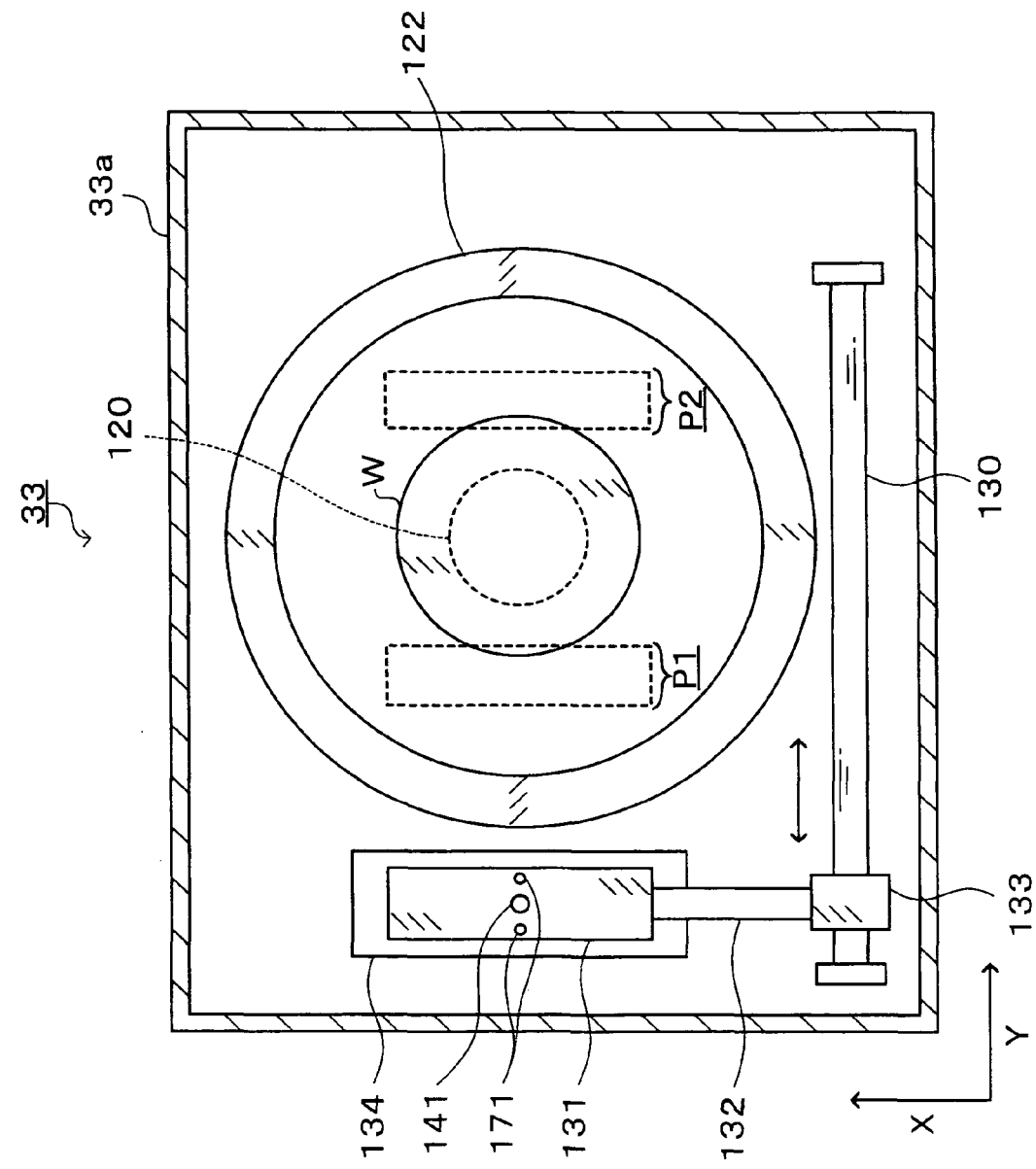
[FIG. 5]
An explanatory view of a transverse section showing the outline of the configuration of the solvent supply unit

Next, the configuration of the above-described solvent supply unit 33 will be described in detail. FIG. 4 is an explanatory view of a longitudinal section showing the outline of the configuration of the solvent supply unit 33, and FIG. 5 is an explanatory view of a transverse section showing the outline of the configuration of the solvent supply unit 33. As shown in FIG. 4, the solvent supply unit 33 has a casing 33a in which a spin chuck 120 as a holding member for holding the wafer W is provided at the central portion. The spin chuck 120 has a horizontal upper surface which is provided with, for example, a suction port (not shown) for sucking the wafer W. Suction from the suction port allows the wafer W to be sucked onto the spin chuck 120.

The spin chuck 120 is provided with, for example, a chuck drive mechanism 121 for rotating and raising and lowering the spin chuck 120. The chuck drive mechanism 121 includes, for example, a rotary drive unit (not shown) such as a motor for rotating the spin chuck 120 at a predetermined speed, and a raising and lowering unit (not shown) such as a motor or a cylinder for raising and lowering the spin chuck 120. The chuck drive mechanism 121 can be used to raise and lower the wafer W on the spin chuck 120 at a predetermined timing and rotate the wafer W at a predetermined speed.

Around the spin chuck 120, a cup 122 is provided for exhausting the atmosphere around the wafer W. The cup 122 is formed, for example, in an almost cylindrical shape with its bottom surface closed. The bottom surface 122a is connected with an exhaust pipe 123 in communication with, for example, an exhauster (not shown) of a factory and therefore can exhaust the atmosphere in the cup 122 to the lower side.

As shown in FIG. 5, a rail 130 extending along the Y-direction is formed, for example, on the side of the negative direction in the X-direction (the lower direction in FIG. 5) of the cup 122. The rail 130 is formed, for example, from the outside of the cup 122 on the side of the negative direction in the Y-direction (the left direction in FIG. 5) to the vicinity of the end portion of the cup 122 on the side of the positive direction in the Y-direction (the right direction in FIG. 5). To the rail 130, an arm 132 is attached which supports a solvent vapor discharge nozzle 131. The arm 132 is movable in the Y-direction on the rail 130, for example, by means of a drive unit 133, and can move from a waiting section 134 provided outside the cup 122 to a position above the wafer W in the cup 122. The arm 132 is also movable in the vertical direction, for example, by means of the aforementioned drive unit 133 and can raise and lower the solvent vapor discharge nozzle 131. Note that the rail 130, the arm 132 and the drive unit 133 form a nozzle moving mechanism in this embodiment.

Figure 6:
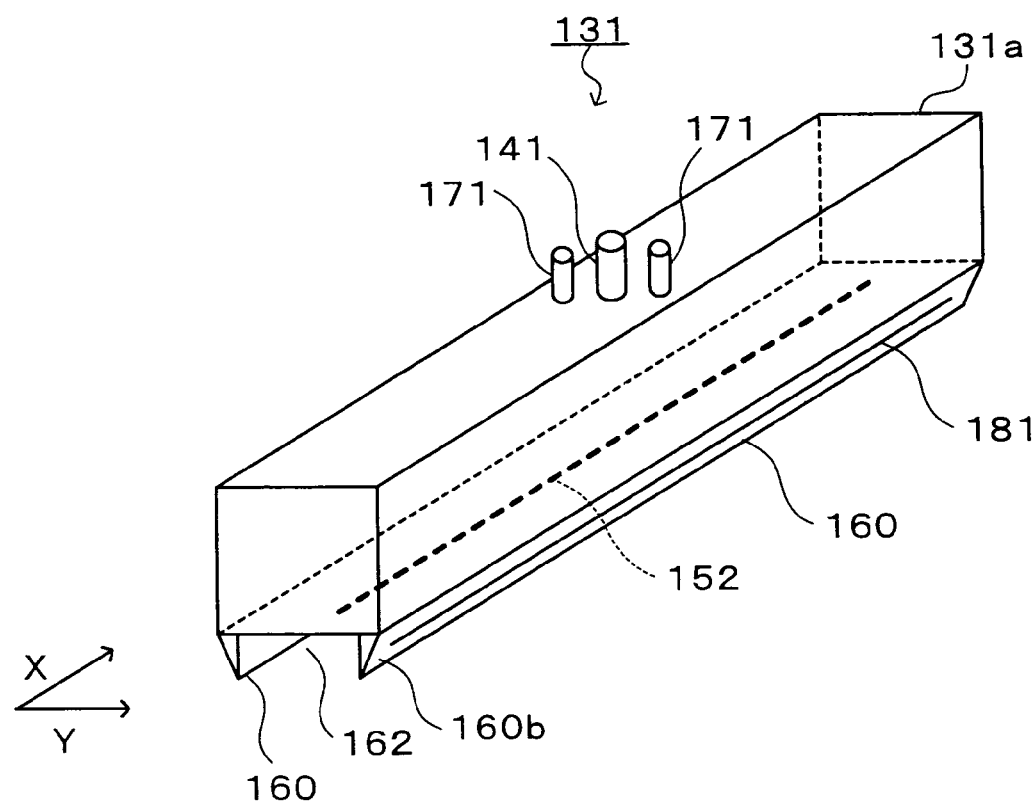
[FIG. 6]
A perspective view of a solvent vapor discharge nozzle.
Figure 7:
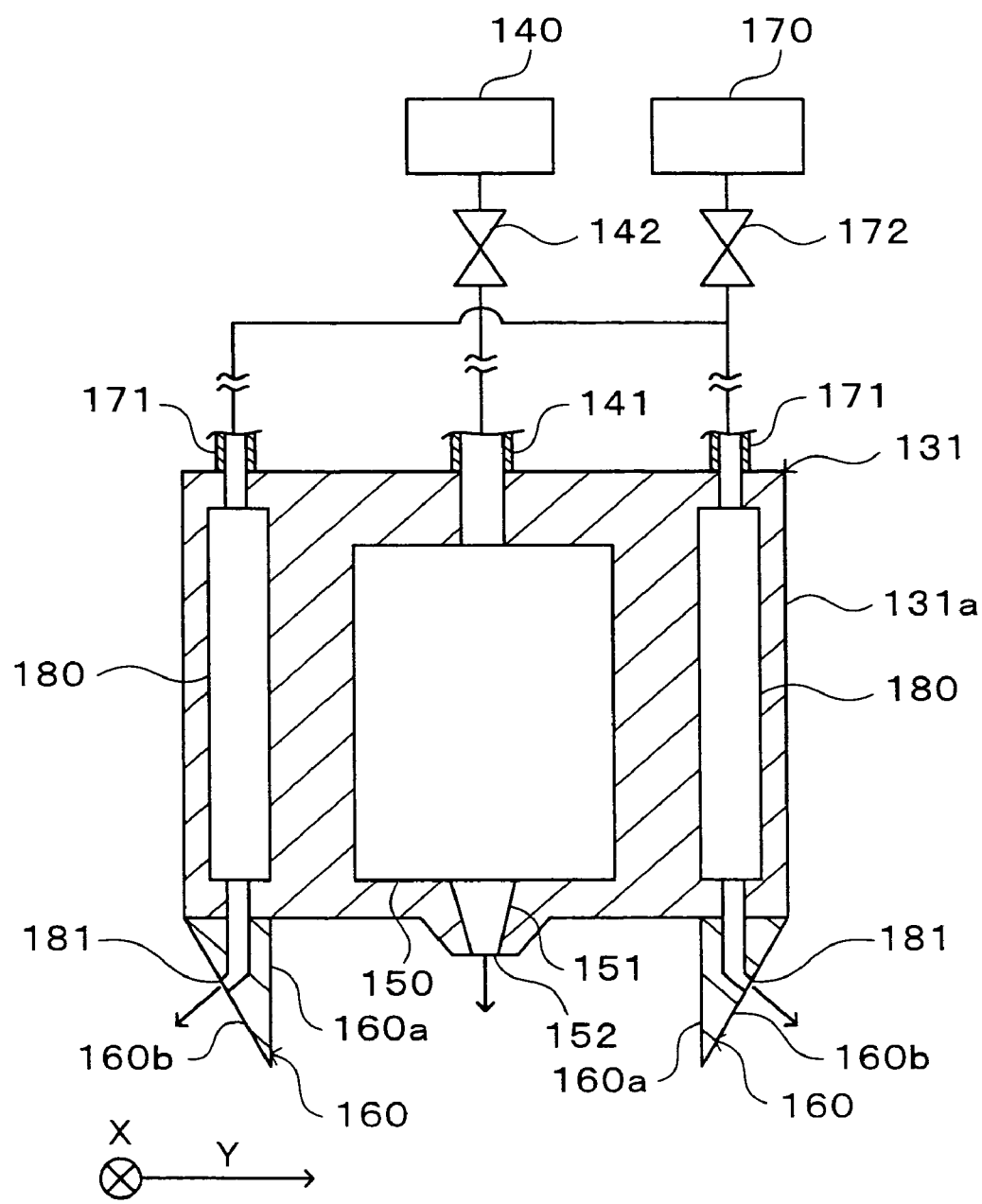
[FIG. 7]
A longitudinal-sectional view of the solvent vapor discharge nozzle as seen in the X-direction.

The solvent vapor discharge nozzle 131 has a main body 131a having, as shown in FIG. 5 and FIG. 6, an almost rectangular parallelepiped shape slightly longer than the dimension of the diameter of the wafer W and is supported by the arm 132 such that its longitudinal direction is oriented in the X-direction. To the upper surface of the main body 131a, a solvent supply pipe 141 is connected which is in communication with a solvent vapor supply source 140 provided, for example, outside the casing 33a as shown in FIG. 4 and FIG. 7. The solvent vapor supply source 140 stores a solvent vapor for causing the resist pattern formed on the wafer W to swell, for example, an organic solvent such as NMP (n-methyl-pyrrolidone), DMSO (dimethyl sulfoxide), GBL (gamma-butyrolactone), acetone, IPA (isopropyl alcohol), PEGMA, cyclohexanone, ethyl lactate or the like. The solvent supply pipe 141 is provided with an opening/closing valve 142 which enables control of the timing to supply the solvent vapor.

As shown in FIG. 7, a pressure adjustment room 150 in communication with the solvent supply pipe 141 is formed in the main body 131a of the solvent vapor discharge nozzle 131. The pressure adjustment room 150 is formed between both end portions in the longitudinal direction of the main body 131a. The pressure adjustment room 150 can temporarily store the solvent vapor introduced from the solvent supply pipe 141 so as to uniform the pressure to supply the solvent vapor. A lower surface of the pressure adjustment room 150 communicates via a solvent path 151 with a discharge port 152 opening in the lower surface of the main body 131a. The discharge port 152 is formed, for example, in a slit shape longer than the diameter of the wafer W along the longitudinal direction of the main body 131a as shown in FIG. 6 at a position of the middle portion in the lower surface of the main body 131a. Accordingly, the solvent vapor discharge nozzle 131 can adjust in the pressure adjustment room 150 the pressure of the solvent vapor introduced from the solvent supply pipe 141 and then discharge the solvent vapor downward from the discharge port 152.

As shown in FIG. 7, current plates 160 as current members are provided at both end portions of the lower surface of the solvent vapor discharge nozzle 131. The current plates 160 are formed, for example, between both end portions in the longitudinal direction of the main body 131a as shown in FIG. 6. The current plate 160 has a longitudinal section, as shown in FIG. 7, in an almost triangle shape protruding downward from the lower surface of the main body 131a. The current plate 160 has an inner vertical surface 160a and an outer inclined surface 160b with its normal facing in a depression angle direction. The current plates 160 can prevent the solvent vapor discharged from the discharge port 152 from diffusing outward in the Y-direction of the main body 131a to keep the solvent vapor staying within a region between the two current plates 160. As shown in FIG. 6, at both end portions in the X-direction of the lower surface of the main body 131a, no current plate is provided but openings 162 are formed. The solvent vapor discharged from the discharge port 152 and remaining not in use can be exhausted from the openings 162.

As shown in FIG. 4 or FIG. 7, to the upper portion of the main body 131a of the solvent vapor discharge nozzle 131, a gas supply pipe 171 is connected which is in communication with a gas supply source 170. The gas supply source 170 stores, for example, a nitrogen gas or an inert gas. The gas supply pipe 170 is provided with an opening/closing valve 172 so that the gas supply pipe 170 can be opened/closed at a predetermined timing.

The gas supply pipe 171 is in communication with, for example, gas paths 180 passing through the inside of the main body 131a as shown in FIG. 7. The gas paths 180 vertically pass between both end portions in the Y-direction of the main body 131a and through the current plates 160, and are in communication with gas supply ports 181 opening in the inclined surfaces 160b of the current plates 160. The gas supply port 181 is formed to discharge the gas, for example, in the depression angle direction (obliquely downward) outside the main body 131a. The gas supply ports 181 are formed, for example, in a slit shape between both end portions in the longitudinal direction of the main body 131a as shown in FIG. 6. Supply of the gas from the gas supply ports 181 allows surroundings outside the current plates 160 to be kept in the atmosphere of the nitrogen gas or the inert gas.

To the upper surface of the casing 33a of the solvent supply unit 33, a gas supply pipe 190 in communication with a not-shown gas supply unit is connected to be able to supply a predetermined gas, for example, the nitrogen gas or the inert gas into the casing 33a. This gas supply and the exhaust by the above-described exhaust pipe 123 can form in the casing 33a downflow passing through the cup 122 so as to maintain a clean atmosphere in the cup 122.

Note that the solvent supply unit 34 has, for example, the same configuration as that of the solvent supply unit 33 and its description will be omitted.

Next, the process in the above-described solvent supply unit 33 will be described in conjunction with the process in the photolithography steps performed in the coating and developing treatment system 1.

First of all, one wafer W is taken out of the cassette C on the cassette mounting table 5 by the wafer carrier 7 and carried to the temperature regulating unit 60 in the third processing unit group G3. The wafer W carried to the temperature regulating unit 60 is temperature-regulated to a predetermined temperature, and is then carried by the first carrier unit 10 into the bottom coating unit 23 where an anti-reflection film is formed on the wafer W. The wafer W formed with the anti-reflection film is sequentially carried by the first carrier unit 10 to the heating unit 92, the high-temperature thermal processing unit 65, and the high-precision temperature regulating unit 70 so that predetermined processing is performed in each of the units. Thereafter, a resist film is formed on the wafer W in the resist coating unit 20.

The wafer W on which the resist film has been formed is carried by the first carrier unit 10 to the pre-baking unit 71 and then carried by the second carrier unit 11 to the edge exposure unit 94 and the high-precision temperature regulating unit 83 in sequence so that the wafer W is subjected to predetermined processing in each of the units. Thereafter, the wafer W is carried by the wafer carrier 101 in the interface section 4 to the not-shown aligner. In the aligner, a predetermined pattern is exposed on the resist film on the wafer W. The wafer W for which exposure processing has been finished is carried by the wafer carrier 101, for example, to the post-exposure baking unit 84 where the wafer W is subjected to heat-processing, and then carried by the second carrier unit 11 to the high-precision temperature regulating unit 81 where the wafer W is temperature-regulated. The wafer W is then carried to the developing treatment unit 30 where the resist film on the wafer W is developed. In this developing treatment, for example, the exposed portion of the resist film is dissolved so that the pattern is formed in the resist film. The wafer W for which developing treatment has been finished is then carried by the second carrier unit 11 to the post-baking unit 75 where the wafer W is subjected to heat-processing, and is then carried to the high-precision temperature regulating unit 63 where the wafer W is temperature-regulated. Thus, a resist pattern with a predetermined dimension is formed on the wafer W. After formation of the resist pattern on the wafer W, the wafer W is carried by the first carrier unit 10 to the solvent supply unit 33.

Here, solvent supply treatment performed in the solvent supply unit 33 will be described in detail. As shown in FIG. 4, for example, downflow is formed at all times in the casing 33*a* of the solvent supply unit 33 by the gas supply from the gas supply pipe 190 and the exhaust from the exhaust pipe 123, so that a clean atmosphere is maintained inside the cup 122. When the wafer W is carried into the solvent supply unit 33 and held on the spin chuck 120, the solvent vapor discharge nozzle 131 waiting at the waiting section 134 as shown in FIG. 5 moves in the positive direction side in the Y-direction to a start position P1 (shown in a dotted line in FIG. 5) before the end portion of the wafer W on the negative direction side in the Y-direction as seen in plan view. Thereafter, the solvent vapor discharge nozzle 131 is lowered so that the lower end portions of the current plates 160 are brought close to the front surface of the wafer W.

Then, for example, the opening/closing valve 142 is opened to introduce the solvent vapor in the solvent vapor supply source 140 into the solvent vapor discharge nozzle 131, whereby the solvent vapor passes through the solvent vapor discharge nozzle 131 and is started to be discharged from the discharge port 152. The discharge supplies the solvent vapor into the region between the current plates 160 on the lower surface of the solvent vapor discharge nozzle 131. Further, the opening/closing valve 172 is also opened, whereby, for example, the nitrogen gas in the gas supply source 170 is started to be discharged from the gas supply ports 160 of the current plates 160. This discharge of the nitrogen gas maintains the nitrogen gas atmosphere around the outside of the current plates 160.

Figure 8:
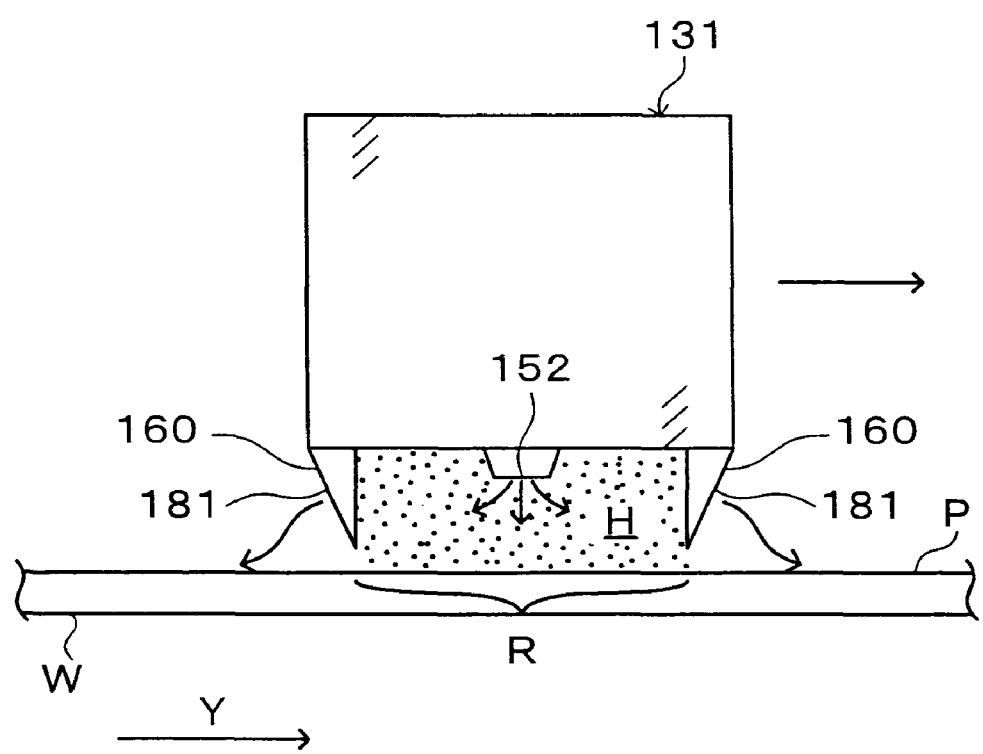
[FIG. 8]
An explanatory view showing an appearance in which a solvent vapor discharge nozzle is discharging a solvent vapor.
Figure 9:
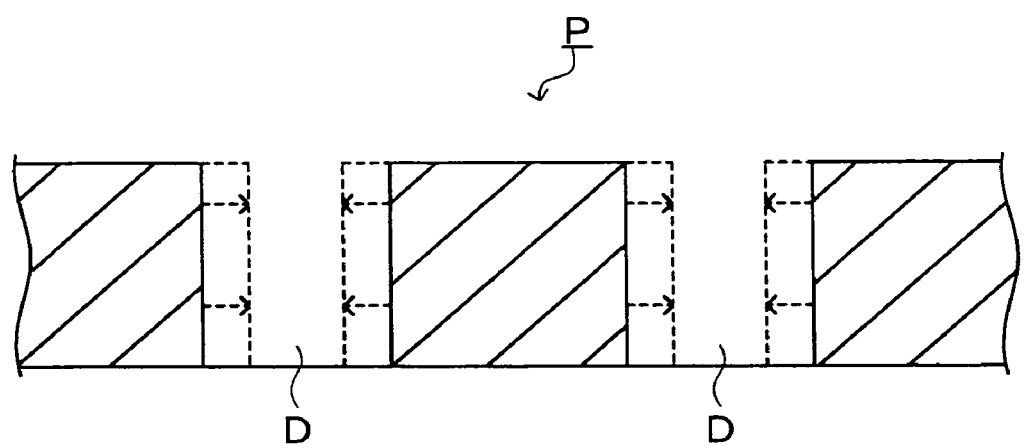
[FIG. 9]
An explanatory view of a longitudinal section showing an appearance in which a resist pattern swells.

When the discharge of the solvent vapor and the nitrogen gas is started at the start position P1 shown in FIG. 5, the solvent vapor discharge nozzle 131 horizontally moves along the Y-direction from the start position P1 to a stop position P2 (shown by a dotted line in FIG. 5) outside on the positive direction side in the Y-direction of the wafer W. During the movement, the solvent vapor is discharged from the discharge port 152 to a space H between the two current plates 160 and the wafer W as shown in FIG. 8, so that the solvent vapor is supplied to a supply region R in an almost rectangular shape on a part of the wafer W. The movement of the solvent vapor discharge nozzle 131 shifts the supply region R from one end portion to the other end portion on the wafer W, so that the solvent vapor is supplied on the entire surface of the wafer W. Further, during the movement of the solvent vapor discharge nozzle 131, the supply of the nitrogen gas maintains the outside of the current plates 160 in the front and back of the solvent vapor discharge nozzle 131 in the nitrogen gas atmosphere to prevent the solvent vapor in the space H from flowing to the outside of the current plates 160. Such supply of the solvent vapor onto the front surface of the wafer W causes the resist pattern P formed on the front surface of the wafer W to swell as shown in FIG. 9, for example, to decrease the line width and the diameter D of the hole to desired dimensions. In this way, a fine resist pattern P with the desired dimensions is formed on the wafer W. Note that the amounts of decrease in the line width and the diameter of the hole are measured in advance by experiment or the like, so that the pattern with dimensions calculated back from the amounts is exposed, for example, in the above-described exposure processing.

The solvent vapor discharge nozzle 131 moved to the stop position P2 is returned to the waiting section 134 after the discharge of the solvent vapor and the nitrogen gas from the nozzle 131 is stopped. Thereafter, the wafer W is transferred from the spin chuck 120 to the second carrier unit 11 and carried out from the solvent supply unit 33. Consequently, a series of solvent supply treatment steps is completed.

The wafer W for which the solvent supply treatment has been finished is carried, for example, to the high-temperature thermal processing unit 66 where the wafer W is subjected to heat-processing. The heat-processing evaporates excessive solvent to harden the resist pattern P. The wafer W is then temperature-regulated in the high-precision temperature regulating unit 64, then carried by the first carrier unit 10 to the transition unit 61, and then returned to the cassette C by the wafer carrier 7. Consequently, a series of photolithography steps in the coating and developing treatment system 1 is completed.

According to the above embodiment, since solvent vapor is supplied from the solvent vapor discharge nozzle 131 to the supply region R on a part of the wafer W and the solvent vapor discharge nozzle 131 is moved to shift the supply region R, a desired amount of solvent vapor can be supplied to each portion of the resist pattern P on the wafer W. As a result, the amount of swell of the resist pattern P by the solvent vapor can be precisely controlled, thus finally forming the resist pattern with a desired dimension. Further, a desired amount of solvent vapor can be evenly supplied within the plane of the wafer W, resulting in uniform dimension of the resist pattern P within the plane of the wafer. Therefore, a fine resist pattern P with a desired dimension can be evenly formed within the plane of the wafer.

According to the above-described embodiment, since the current plates 160 are attached to the lower surface of the solvent vapor discharge nozzle 131, the solvent vapor discharged from the discharge port 152 is prevented from diffusing from the lower surface of the solvent vapor discharge nozzle 131 in the movement direction of the solvent vapor discharge nozzle 131. As a result of this, the amount of the solvent vapor supplied to each portion on the wafer W is precisely controlled so that the solvent vapor can be evenly supplied within the plane of the wafer.

Further, since the openings 162 are formed on both ends in the X-direction of the lower surface of the solvent vapor discharge nozzle 131, the solvent vapor supplied to the space H and remaining not in use can be preferably exhausted from the sides where the solvent vapor has no effect on the resist pattern P.

Furthermore, since the gas supply ports 181 are provided in the current plates 160, the nitrogen gas can be supplied to the outside of the current plates 160 during the movement of the solvent vapor discharge nozzle 131 to maintain surroundings outside the current plates 160 in the nitrogen gas atmosphere. This configuration allows the nitrogen gas to serve as an air curtain to prevent the solvent vapor from flowing out from the space H between the two current plates 160. Further, even if the solvent vapor leaks from the space H, the solvent vapor can be diluted to prevent the resist pattern P from excessively swelling.

The gas supply ports 181 are formed to discharge the nitrogen gas outward with respect to the current plates 160 and therefore can prevent the discharged nitrogen gas from flowing back into the inside of the current plates 160 to interfere with swelling of the resist pattern P.

While supply of the solvent vapor to the entire wafer surface is performed only one time in the above-described embodiment, the supply may be performed a plurality of times with the shift direction of the supply region R changed. For example, in the above-described embodiment, after the solvent vapor discharge nozzle 131 moves to the stop position P2, the solvent vapor discharge nozzle 131 may move above the front surface of the wafer W from the stop position P2 to the start position P1 while supplying the solvent vapor. This further uniforms the supply amount of the solvent vapor within the plane of the wafer W to further improve the uniformity in dimension of the resist pattern P. Note that it is also adoptable that, in this example, the solvent vapor discharge nozzle 131 once returns to the start position P1, the wafer W is rotated 180° by the spin chuck 120, and the solvent vapor discharge nozzle 131 then moves again from the start position P1 to the stop position P2 while discharging the solvent vapor.

Figure 10:
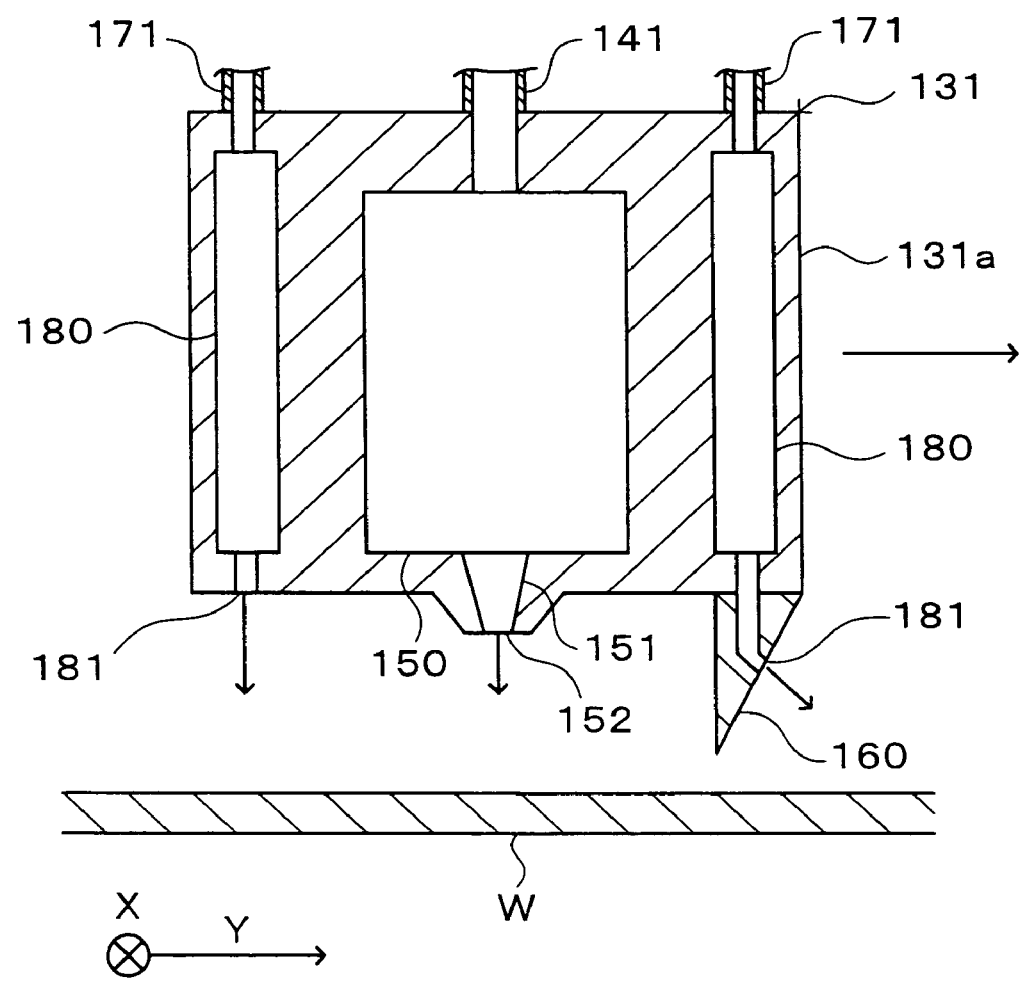
[FIG. 10]
A longitudinal-sectional view of the solvent vapor discharge nozzle provided with a current plate on one side as seen in the X-direction.

While the current plates 160 are provided at both end portions of the lower surface of the solvent vapor discharge nozzle 131 in the above-described embodiment, the current plate 161 may be provided only at the end portion on the side of movement direction of the solvent vapor discharge nozzle 131 as shown in FIG. 10. Also in this case, the solvent vapor discharged from the discharge port 152 is prevented from diffusing ahead of the solvent vapor discharge nozzle 131. Since the resist pattern P before swelling ahead of the solvent vapor discharge nozzle 131 sensitively reacts even with a small amount of the solvent vapor, irregular diffusion of the solvent vapor into this region is prevented to stabilize the supply amount of the solvent vapor to the supply region R shifted on the front surface of the wafer, whereby the resist pattern P with a desired dimension can be uniformly formed. Note that, in this case, the gas supply ports 181 for supplying the nitrogen gas or the inert gas may be formed near the end portion on the rear side of the lower surface of the solvent vapor discharge nozzle 131.

Figure 11:
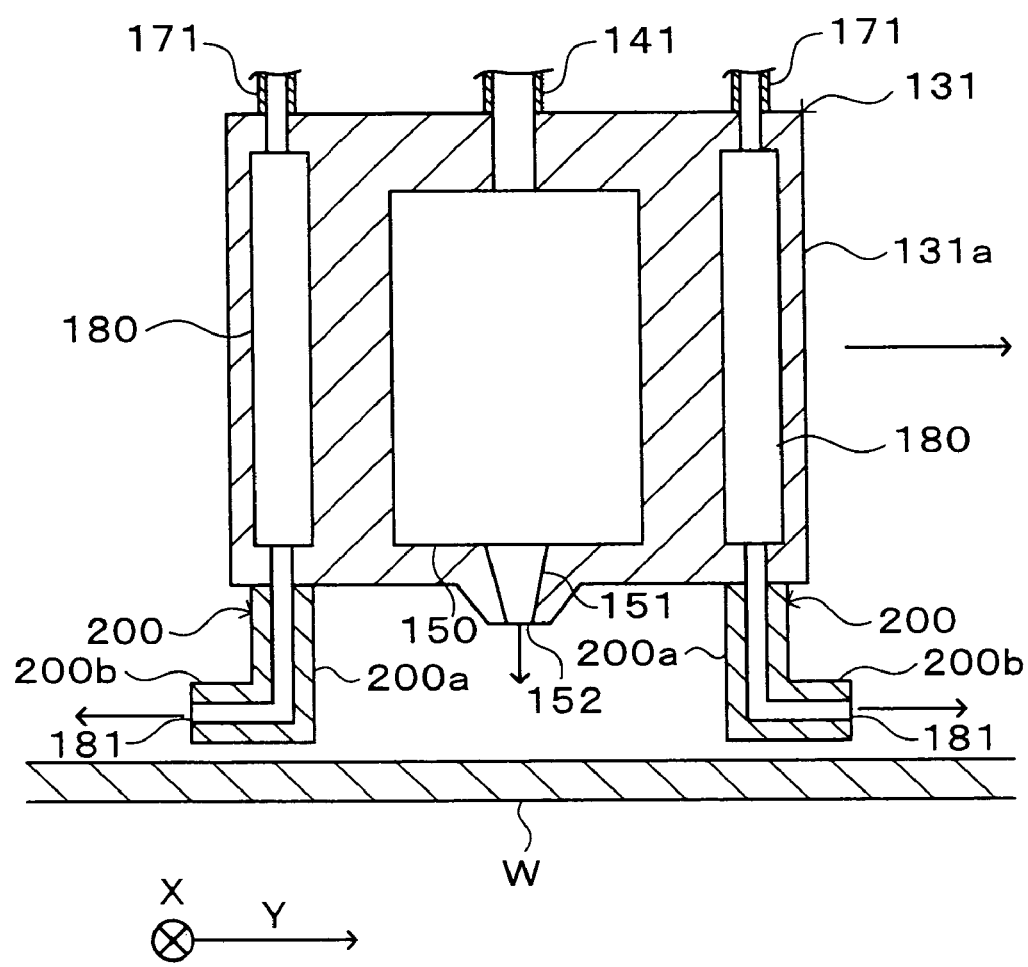
[FIG. 11]
A longitudinal-sectional view of the solvent vapor discharge nozzle provided with L-shaped current plates as seen in the X-direction.

While the current plate 160 in the above-described embodiment is formed to have a longitudinal section as seen in the X-direction in an almost triangle shape, it may be formed to have a longitudinal section in an almost L-shape as shown in FIG. 11. In this case, for example, current plates 200 have vertical portions 200a formed on both end portions in the Y-direction on the lower surface of the main body 131a and horizontal portions 200b horizontally formed outward from the lower end portions of the vertical portions 200a. Gas paths 180, through which the nitrogen gas flows, pass through the inside of the vertical portions 200a and the horizontal portions 200b, and gas supply ports 181 are opened at the outer tip portions of the horizontal portions 200b. The solvent vapor discharge nozzle 131 moves in the Y-direction with the horizontal portions 200b close to the front surface of the wafer W while discharging the solvent vapor. In this case, since the solvent vapor inside between the two current plates 200 is blocked by the horizontal portions 200b, the diffusion of the solvent vapor to the outside of the current plates 200 can be prevented more surely as compared to the case of the current plates having a longitudinal section in the almost triangle shape. In this example, the gas supply ports 181 may be opened on the lower surface side of the horizontal portions 200b.

Figure 12:
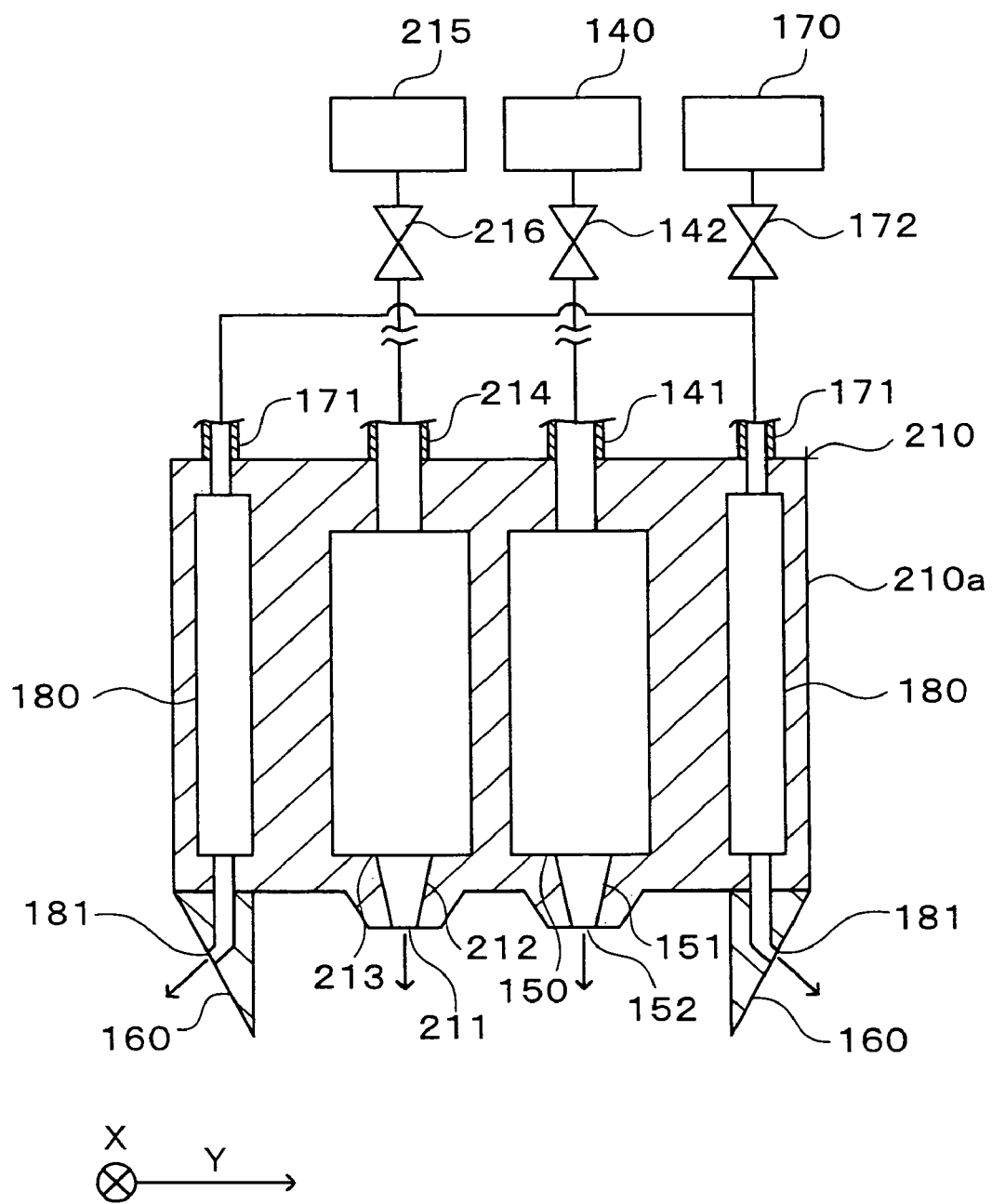
[FIG. 12]
A longitudinal-sectional view of the solvent vapor discharge nozzle with a discharge port for a homogenizing solvent vapor as seen in the X-direction.

As shown in FIG. 12, a solvent vapor discharge nozzle 210 may include a sub discharge port 211 for supplying another solvent vapor to homogenize the surface of the resist pattern P on the wafer W. Note that the aforementioned other solvent vapor is referred to as a "homogenizing solvent vapor" hereinafter.

For example, the sub-discharge port 211 is provided in parallel with the sub-discharge port 211 at the central portion of the lower surface of a main body 210a of the solvent vapor discharge nozzle 210. The sub-discharge port 211 is provided on the negative direction side in the Y-direction with respect to the discharge port 152. The sub-discharge port 211 is formed in a slit shape, for example, between both end portions in the longitudinal direction of the main body 210a. The sub-discharge port 211 is in communication with a pressure adjustment room 213 via a solvent path 212. The pressure adjustment room 213 is in communication with a solvent supply pipe 214 connected to the upper surface of the main body 210a, and the solvent supply pipe 214 is in communication with a solvent vapor supply source 215.

The solvent vapor supply source 215 stores, for example, a homogenizing solvent vapor having a molecular mass, for example, smaller than that of the solvent vapor discharged from the discharge port 152, such as acetone, NMP (n-methyl-pyrrolidone), DMSO (dimethyl sulfoxide), GBL (gamma-butyrolactone), IPA (isopropyl alcohol), PEGMA, cyclohexanone, ethyl lactate or the like. The solvent supply pipe 214 is provided with an opening/closing valve 216. This configuration allows the homogenizing solvent vapor in the solvent vapor supply source 215 to be introduced into the solvent vapor discharge nozzle 210 via the solvent supply pipe 214 and discharged from the sub-discharge port 211 in the lower surface of the solvent vapor discharge nozzle 210. Note that the configuration of other portions of the solvent vapor discharge nozzle 210 is the same as that of the above-described solvent vapor discharge nozzle 131.

Figure 13:
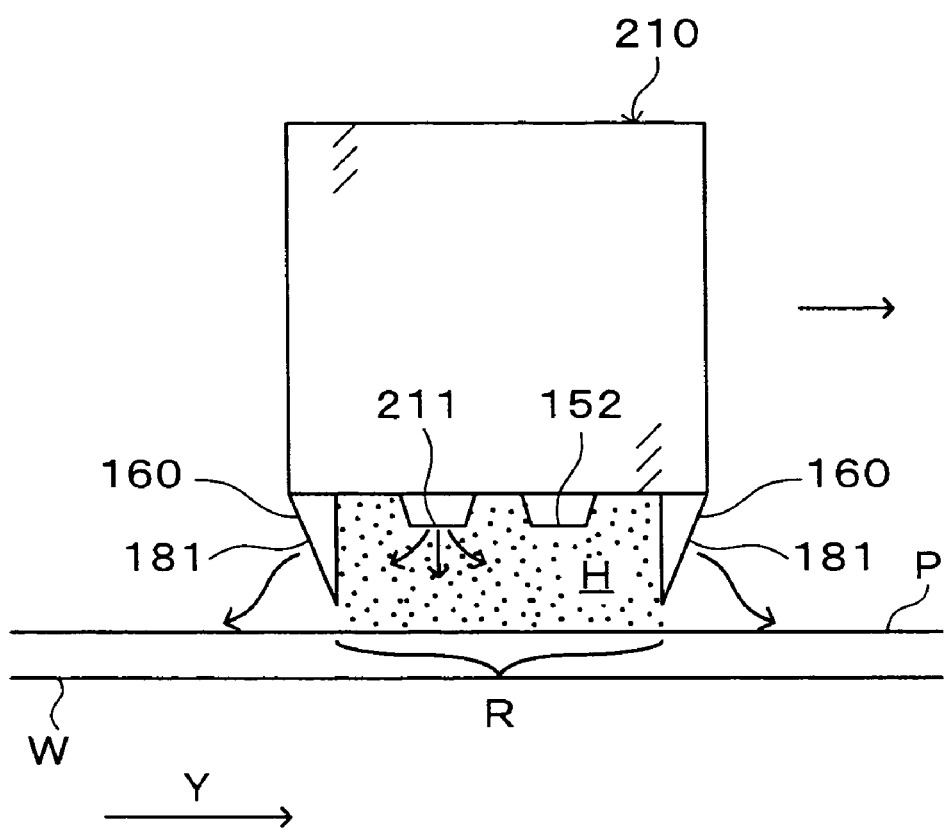
[FIG. 13]
An explanatory view showing an appearance in which the solvent vapor discharge nozzle is discharging the homogenizing solvent vapor.
Figure 14:
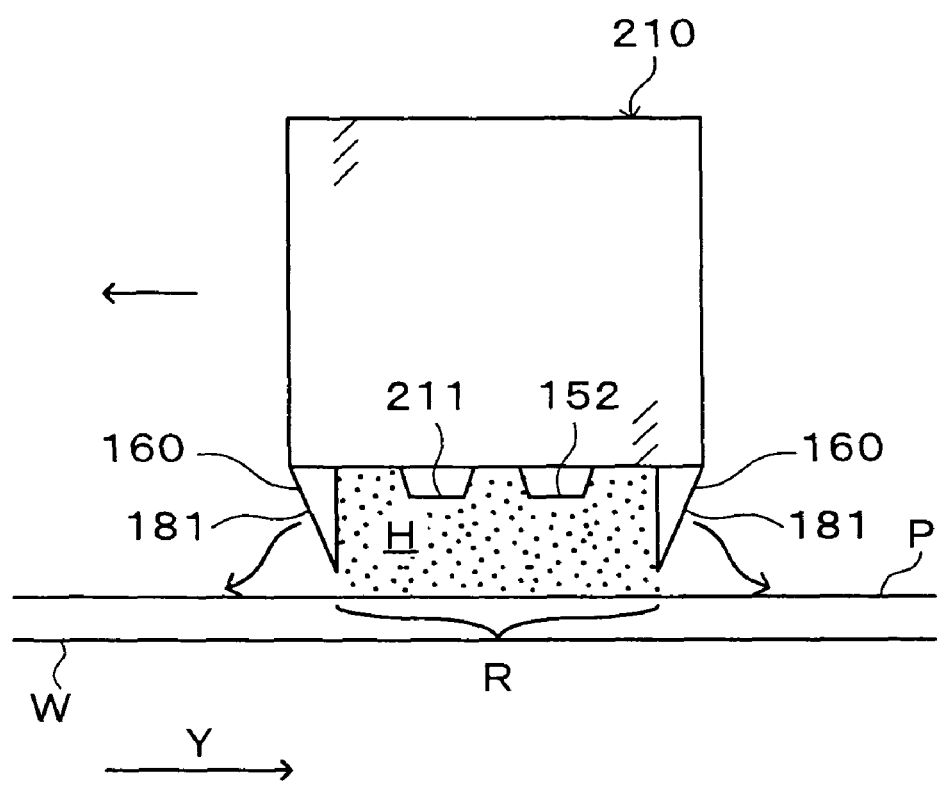
[FIG. 14]
An explanatory view showing an appearance in which the solvent vapor discharge nozzle is discharging the solvent vapor.

At the time of solvent supply treatment, the homogenizing solvent vapor is discharged from the sub-discharge port 211 of the solvent vapor discharge nozzle 210 located at the start position P1 as in the above-described embodiment. As shown in FIG. 13, the solvent vapor discharge nozzle 210 moves to the stop position P2 outside on the positive direction side in the Y-direction of the wafer W while discharging the homogenizing solvent vapor from the sub-discharge port 211. This supplies the homogenizing solvent vapor onto the wafer W to improve the quality of the surface of the resist pattern P, so that the distribution of hydrophilic molecules and hydrophobic molecules on the surface is uniformed. Thereafter, the discharge of the homogenizing solvent vapor is stopped at the stop position P2, and the solvent vapor for swelling the resist pattern P is started to be discharged instead from the discharge port 152. The solvent vapor discharge nozzle 210 moves from the stop position P2 to the start position P1 while discharging the solvent vapor from the discharge port 152 as shown in FIG. 14. In this event, the solvent vapor is supplied onto the entire front surface of the wafer W as in the above-described embodiment to swell the resist pattern P.

According to this example, it is possible to homogenize the surface of the resist pattern P on the wafer W and then supply the solvent vapor for swelling the resist pattern P. As a result, the solvent vapor for swelling can be uniformly adsorbed, for example, by the surface of the resist pattern P to cause the resist pattern P to uniformly swell within the plane of the wafer. Accordingly, the in-plane uniformity of the dimension of the resist pattern P of the finally formed resist pattern P can be improved.

Note that while the solvent vapor for swell and the homogenizing solvent vapor can be supplied from the same solvent vapor discharge nozzle 210 in the above example, solvent vapor discharge nozzles for supplying the respective solvent vapors may be provided so that the discrete solvent vapor discharge nozzle are used for supply.

The above embodiment shows an example of the present invention, and the present invention is not limited to this embodiment but may employ various forms. Various modifications may be made to the illustrated embodiment within the scope the same as or equivalent to that of the present invention. For example, the current plates 160 and 200 and the solvent vapor discharge nozzles 131 and 210 described in the above embodiment may have other shapes and lengths. While the supply of the solvent vapor to the wafer W is performed in the dedicated solvent vapor supply unit 33 in the above embodiment, the function similar to that of the solvent vapor supply unit 33 may be provided in the existing other treatment unit, for example, the developing treatment unit 30 to perform the supply of the solvent vapor in the treatment unit. The above embodiment is an example of supplying the solvent vapor to the wafer W having the resist pattern P formed thereon, and the present invention is also applicable to the case of supplying the solvent vapor to substrates other than the wafer, such as an FPD (Flat Panel Display), and a mask reticule for a photomask.

INDUSTRIAL APPLICABILITY

The present invention is useful in uniformly forming a fine resist pattern with a desired dimension within the plane of a substrate.

What is claimed is:

1. A substrate treatment apparatus for treating a substrate having a resist pattern formed thereon, comprising:
   a solvent vapor discharge nozzle which discharges a solvent vapor for swelling the resist pattern to a partial region on a front surface of the substrate; and
   a nozzle moving mechanism which moves the solvent vapor discharge nozzle discharging the solvent vapor along the front surface of the substrate,
   wherein said solvent vapor discharge nozzle includes a discharge port which discharges the solvent vapor toward the substrate, a current member which straightens the current of the solvent vapor to prevent the solvent vapor from diffusing from the region to which the solvent vapor is discharged from the discharge port and a main body including an almost rectangular parallelepiped shape long in a direction perpendicular to the moving direction of said solvent vapor discharge nozzle,
   wherein the discharge port is disposed in a lower surface of the main body along a longitudinal direction of the main body to be able to discharge the solvent vapor over at least a length of a diameter of the substrate,
   wherein the current member is provided at least ahead of the discharge port in the moving direction on the lower surface of the main body of said solvent vapor discharge nozzle, the current member including a current plate,
   wherein the solvent vapor discharge nozzle is provided with a gas supply port which supplies an inert gas or a nitrogen gas to a periphery of the region on the substrate to which the solvent vapor is discharged, the gas supply port directs the inert gas or nitrogen gas outwardly with respect to the current member, and
   wherein the gas supply port is integrally formed within the current plate.

2. The substrate treatment apparatus as set forth in claim 1, wherein the current members are provided on both sides of the discharge port in the moving direction.

3. The substrate treatment apparatus as set forth in claim 2, wherein said solvent vapor discharge nozzle has an opening for allowing the solvent vapor to pass in the direction perpendicular to the moving direction at the lower surface of the main body.

4. The substrate treatment apparatus as set forth in claim 1, wherein the discharge port is formed at a middle portion in the moving direction of the lower surface of the main body, and
   wherein the current member protrudes downward from an end portion in the moving direction of the lower surface of the main body, and is formed in a length corresponding to the discharge port along the longitudinal direction of the main body.

5. The substrate treatment apparatus as set forth in claim 1, wherein the gas supply port is provided ahead of the discharge port in the moving direction of said solvent vapor discharge nozzle.

6. The substrate treatment apparatus as set forth in claim 1, wherein the gas supply ports are provided on both sides of the discharge port in the moving direction of said solvent vapor discharge nozzle.

7. The substrate treatment apparatus as set forth in claim 1, wherein said solvent vapor discharge nozzle has another discharge port for discharging another solvent vapor for homogenizing the surface of the resist pattern.

8. A substrate treatment apparatus for treating a substrate having a resist pattern formed thereon, comprising:

a solvent vapor discharge nozzle which discharges a solvent vapor for swelling the resist pattern to a partial region on a front surface of the substrate; and
a nozzle moving mechanism which moves the solvent vapor discharge nozzle discharging the solvent vapor along the front surface of the substrate,
wherein said solvent vapor discharge nozzle includes a discharge port which discharges the solvent vapor toward the substrate, a current member which straightens the current of the solvent vapor to prevent the solvent vapor from diffusing from the region to which the solvent vapor is discharged from the discharge port,
wherein said solvent vapor discharge nozzle is provided with a gas supply port for supplying an inert gas or a nitrogen gas to a periphery of the region on the substrate to which the solvent vapor is discharged, and
wherein the gas supply port is integrally formed in the current member.

\* \* \* \* \*